United States Patent
Chen et al.

(10) Patent No.: US 11,422,177 B2
(45) Date of Patent: Aug. 23, 2022

(54) SPATIAL SPECTRUM ESTIMATION METHOD WITH ENHANCED DEGREE-OF-FREEDOM BASED ON BLOCK SAMPLING TENSOR CONSTRUCTION FOR COPRIME PLANAR ARRAY

(71) Applicant: ZHEJIANG UNIVERSITY, Hangzhou (CN)

(72) Inventors: Jiming Chen, Hangzhou (CN); Hang Zheng, Hangzhou (CN); Zhiguo Shi, Hangzhou (CN); Chengwei Zhou, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/395,480

(22) Filed: Aug. 6, 2021

(65) Prior Publication Data
US 2021/0364564 A1 Nov. 25, 2021

Related U.S. Application Data

(63) Continuation of application No. PCT/CN2020/088568, filed on May 3, 2020.

(51) Int. Cl.
*G01R 29/10* (2006.01)
*G01S 3/74* (2006.01)
(Continued)

(52) U.S. Cl.
CPC .......... *G01R 29/10* (2013.01); *G01R 29/0892* (2013.01); *G01S 3/74* (2013.01); *G06K 9/623* (2013.01)

(58) Field of Classification Search
CPC .......... G01S 3/74; G06K 9/623; G01R 29/10; G01R 29/0892
See application file for complete search history.

(56) References Cited

U.S. PATENT DOCUMENTS

2016/0091598 A1 3/2016 Vouras et al.

FOREIGN PATENT DOCUMENTS

| CN | 107037392 A | 8/2017 |
|---|---|---|
| CN | 107611624 A | 1/2018 |

(Continued)

OTHER PUBLICATIONS

JP First Office Action (2021-541670); dated Jan. 5, 2022.
(Continued)

*Primary Examiner* — Dao L Phan
(74) *Attorney, Agent, or Firm* — W&G Law Group

(57) ABSTRACT

Disclosed is a spatial spectrum estimation method with enhanced degree-of-freedom based on block sampling tensor construction for coprime planar array, which mainly solves the multi-dimensional information loss in signals and degree-of-freedom limitation in the existing methods and which is implemented by the following steps: constructing a coprime planar array; modeling block sampling tensors of the coprime planar array; deducing coarray statistics based on the block sampling cross-correlation tensor; obtaining block sampling coarray signals of a virtual uniform array; constructing a three-dimensional block sampling coarray tensor and its fourth-order auto-correlation statistics; constructing signal and noise subspaces based on fourth-order auto-correlation tensor decomposition; estimating a tensor spatial spectrum with enhanced degrees-of-freedom. In the present disclosure, the block sampling tensors of the coprime planar array is constructed, where a coarray tensor is deduced, to realize tensor spatial spectrum estimation with enhanced degrees-of-freedom by extracting signal-to-signal subspace features from the four-order self-correlation tensor.

6 Claims, 2 Drawing Sheets

(51) Int. Cl.
*G06K 9/62* (2022.01)
*G01R 29/08* (2006.01)

(56) References Cited

FOREIGN PATENT DOCUMENTS

| | | |
|---|---|---|
| CN | 108710102 A | 10/2018 |
| CN | 109471086 A | 3/2019 |
| CN | 110133576 A | 8/2019 |
| CN | 110927661 A | 3/2020 |
| JP | 2017116425 A | 6/2017 |

OTHER PUBLICATIONS

International Search Report (PCT/CN2020/088568); dated Feb. 1, 2021.
"Two-Dimensional Coprime Vector-Sensor Array Signal Processing Based on Tensor Decompositions" (Gui, Yufeng et al.) [Aug. 31, 2019].

SPATIAL SPECTRUM ESTIMATION METHOD WITH ENHANCED DEGREE-OF-FREEDOM BASED ON BLOCK SAMPLING TENSOR CONSTRUCTION FOR COPRIME PLANAR ARRAY

TECHNICAL FIELD

The present disclosure belongs to the field of array signal processing technology, in particular to a spatial spectrum estimation technology based on the coprime planar array tensor signal modeling and statistic processing, specifically a spatial spectrum estimation method with enhanced degree-of-freedom based on block sampling tensor construction for coprime planar array, which is applied to passive sounding and positioning.

BACKGROUND

As a two-dimensional sparse array with a systematic architecture, the coprime planar array has the characteristics of large aperture and high degree-of-freedom, and can realize high-precision, high-resolution spatial spectrum estimation; at the same time, by constructing a two-dimensional virtual array and processing based on second-order coarray statistics, the degree-of-freedom of source spatial spectrum estimation can be effectively improved. The traditional spatial spectrum estimation method usually expresses the incident signal with two-dimensional spatial structural information as a vector, calculates the second-order statistics of the multi-snapshots signal in a time-averaged manner, and then derives the second-order equivalent signals in the virtual domain through vectorization, and the spatial smoothing method is used to solve the rank deficient problem of the signal covariance matrix of the single snapshot coarray statistics to construct the spatial spectrum. However, on the one hand, the coprime planar array received signal and its second-order equivalent signals represented in a vector manner not only lose the multi-dimensional spatial structural information, but also easily cause dimensional disasters as the amount of data increases; on the other hand, the construction of the spatial spectrum function based on the single snapshot coarray signals introduces a spatial smoothing method, which causes a certain loss in the degree-of-freedom performance.

In order to solve the above problems, the spatial spectrum estimation method based on tensor signal modeling began to attract attention. As a high-dimensional data structure, tensors can store the original multi-dimensional information of signals. At the same time, multi-dimensional algebraic theories such as high-order singular value decomposition and tensor decomposition also provide abundant analysis tools for multi-dimensional feature extraction of tensor signals. Therefore, the spatial spectrum estimation method based on tensor signal modeling can make full use of the multi-dimensional spatial structural information of the coprime planar array signals. However, the existing method is still based on the actual received tensor signal for processing, and does not use the two-dimensional coprime planar array coarray statistics to construct the tensor space spectrum, and does not achieve the improvement of the degree-of-freedom performance.

SUMMARY

The purpose of the present disclosure is to solve the problem of loss of signal multi-dimensional spatial structural information and loss of degree-of-freedom in the above-mentioned coprime planar array spatial spectrum estimation method, and propose a spatial spectrum estimation method with enhanced degree-of-freedom based on the coprime planar array block sampling tensor construction, which provides feasible ideas and effective solutions for constructing a coprime planar array block sampling tensor processing architecture and realizing multi-source tensor spatial spectrum estimation under underdetermined conditions.

The purpose of the present disclosure is achieved through the following technical solutions: a spatial spectrum estimation method with enhanced degree-of-freedom based on block sampling tensor construction for coprime planar array, including the following steps of:

(1) constructing, by a receiving end, an architecture using $4M_xM_y+N_xN_y-1$ physical antenna array elements according to the structure of the coprime planar array; where $M_x$, $N_x$ and $M_y$, $N_y$ are a pair of coprime integers, respectively, and $M_x<N_x$, $M_y<N_y$; the coprime array can be decomposed into two sparse uniform sub-arrays $\mathbb{W}_1$ and $\mathbb{W}_2$;

(2) assuming that there are K far-field narrowband incoherent sources from the direction of $\{(\theta_1,\varphi_1), (\theta_2,\varphi_2), \ldots, (\theta_K,\varphi_K)\}$ and taking L sample snapshots as a block sample, denoted as $T_r$ ($r=1, 2, \ldots, R$), R denoting a number of block samples; wherein within a sampling range of each block, the received signal of the coprime planar array sparse sub-array $\mathbb{W}_1$ can be represented by a three-dimensional tensor $\mathcal{X}_1^{(r)} \in \mathbb{C}^{2M_x \times 2M_y \times L}$ ($r=1, 2, \ldots, R$) as:

$$\mathcal{X}_1^{(r)} = \sum_{k=1}^{K} a_{Mx}(\theta_k,\varphi_k) \circ a_{My}(\theta_k,\varphi_k) \circ s_k + \mathcal{N}_1,$$

wherein, $s_k=[s_{k,1}, s_{k,2}, \ldots, s_{k,L}]^T$ is the multi-snapshot signal waveform corresponding to the $k^{th}$ incident signal source, $[\bullet]^T$ represents the transposition operation, and $\circ$ represents the outer vector product, $\mathcal{N}_1$ is the noise tensor independent of each signal source, $a_{Mx}(\theta_k,\varphi_k)$ and $a_{My}(\theta_k,\varphi_k)$ are the steering vectors of $\mathbb{W}_1$ in the x-axis and y-axis directions, corresponding to the signal source with direction-of-arrival $(\theta_k,\varphi_k)$ and expressed as:

$$a_{Mx}(\theta_k, \varphi_k) = \left[1, e^{-j\pi u_1^{(2)}\sin(\varphi_k)\cos(\theta_k)}, \ldots, e^{-j\pi u_1^{(2M_x)}\sin(\varphi_k)\cos(\theta_k)}\right]^T,$$

$$a_{My}(\theta_k, \varphi_k) = \left[1, e^{-j\pi v_1^{(2)}\sin(\varphi_k)\sin(\theta_k)}, \ldots, e^{-j\pi v_1^{(2M_y)}\sin(\varphi_k)\sin(\theta_k)}\right]^T,$$

wherein, $u_1^{(i_1)}$ ($i_1=1, 2, \ldots, 2M_x$) and $v_1^{(i_2)}$ ($i_2=1, 2, \ldots, 2M_y$) represent actual positions of $i_1^{th}$ and $i_2^{th}$ physical antenna array elements of the sparse sub-array $\mathbb{W}_1$ in the x-axis and y-axis directions respectively, and $u_1^{(1)}=0$, $v_1^{(1)}=0$, $j=\sqrt{-1}$;

within the sampling range of each block, the received signals of the sparse sub-array $\mathbb{W}_2$ can be represented by another three-dimensional tensor $\mathcal{X}_2^{(r)} \in \mathbb{C}^{N_x \times N_y \times L}$ ($r=1, 2, \ldots, R$) as:

$$\mathcal{X}_2^{(r)} = \sum_{k=1}^{K} a_{Nx}(\theta_k,\varphi_k) \circ a_{Ny}(\theta_k,\varphi_k) \circ s_k + \mathcal{N}_2,$$

wherein, $\mathcal{N}_2$ is the noise tensor independent of each source, $a_{Nx}(\theta_k,\varphi_k)$ and $a_{Ny}(\theta_k,\varphi_k)$ are the steering vectors of the sparse sub-array $\mathbb{W}_2$ in the x-axis and y-axis directions respectively, which correspond to the source with direction-of-arrival $(\theta_k,\varphi_k)$, and are expressed as:

$$a_{Nx}(\theta_k, \varphi_k) = \left[1, e^{-j\pi u_2^{(2)}\sin(\varphi_k)\cos(\theta_k)}, \ldots, e^{-j\pi u_2^{(N_x)}\sin(\varphi_k)\cos(\theta_k)}\right]^T,$$

-continued $$a_{N_y}(\theta_k, \varphi_k) = \left[1, e^{-j\pi v_2^{(2)} \sin(\varphi_k)\sin(\theta_k)}, \ldots, e^{-j\pi v_2^{(N_y)} \sin(\varphi_k)\sin(\theta_k)}\right]^T,$$

wherein, $u_2^{(i_3)}$ ($i_3$=1, 2, . . . , $N_x$) and $v_2^{(i_4)}$ ($i_4$=1, 2, . . . , $N_y$) represent actual positions of the $i_3^{th}$ and $i_4^{th}$ physical antenna array elements of the sparse sub-array $\mathcal{W}_2$ in the x-axis and y-axis directions, respectively, and $u_2^{(1)}$=0, $v_2^{(1)}$=0;

for a block sample $T_r$ ($r$=1, 2, . . . , R), the second-order cross-correlation tensor $\hat{\mathcal{R}}_r \in \mathbb{C}^{2M_x \times 2M_y \times N_x \times N_y}$ ($r$=1, 2, . . . , R) of the tensor signals $\mathcal{X}_1^{(r)}$ and $\mathcal{X}_2^{(r)}$ ($r$=1, 2, . . . , R) of the sub-arrays $\mathcal{W}_1$ and $\mathcal{W}_2$ within the block sampling range is calculated, which is expressed as:

$$\hat{\mathcal{R}}_r = \frac{1}{L} \sum_{l=1}^{L} \mathcal{X}_1^{(r)}(l) \circ \mathcal{X}_2^{(r)*}(l),$$

wherein, $\mathcal{X}_1^{(r)}(l)$ and $\mathcal{X}_2^{(r)}(l)$ respectively represent a $l^{th}$ slice of $\mathcal{X}_1^{(r)}$ and $\mathcal{X}_2^{(r)}$ in a direction of a third dimension (i.e., snapshot dimension), and $(\bullet)^*$ represents a conjugation operation;

(3) obtaining an augmented non-uniform virtual array $\mathcal{S}$ from a cross-correlation tensor $\hat{\mathcal{R}}_r$, wherein a position of each virtual array element is expressed as:

$$\mathcal{S} = \{(-M_x n_x d + N_x m_x d, -M_y n_y d + N_y m_y d) | 0 \leq n_x \leq N_x - 1,$$
$$0 \leq m_x \leq 2M_x - 1, 0 \leq n_y \leq N_y - 1, 0 \leq m_y \leq 2M_y - 1\}$$

wherein, a unit spacing d is taken as half of an incident narrowband signal wavelength $\lambda$, that is, $d=\lambda/2$; dimensional sets $\mathbb{J}_1 = \{1, 3\}$ and $\mathbb{J}_2 = \{2, 4\}$ are defined, then the equivalent signals $U_r \in \mathbb{C}^{2M_x \times N_x \times 2M_y N_y}$ ($r$=1, 2, . . . , R) of the augmented virtual array $\mathcal{S}$ can be obtained by modulo $\{\mathbb{J}_1, \mathbb{J}_2\}$ PARAFAC-based unfolding on the ideal value $\mathcal{R}_r$ (noise-free scene) of the cross-correlation tensor $\mathcal{R}_r$, which is ideally expressed as:

$$U_r \triangleq \mathcal{R}_{r\{\mathbb{J}_1, \mathbb{J}_2\}} = \sum_{k=1}^{K} \sigma_k^2 a_x(\theta_k, \varphi_k) \circ a_y(\theta_k, \varphi_k)$$

wherein, $a_x(\theta_k, \varphi_k) = a_{N_x}^*(\theta_k, \varphi_k) \otimes a_{M_x}(\theta_k, \varphi_k)$ and $a_y(\theta_k, \varphi_k) = a_{N_y}^*(\theta_k, \varphi_k) \otimes a_{M_y}(\theta_k, \varphi_k)$ are steering vectors of the augmented virtual array $\mathcal{S}$ ain the x-axis and y-axis directions, which correspond to the $k^{th}$ source with direction-of-arrival $(\theta_k, \varphi_k)$; $\sigma_k^2$ represents a power of the $k^{th}$ source; wherein, $\otimes$ represents a Kronecker product; and the tensor subscripts denote PARAFAC-based tensor unfolding;

(4) $\mathcal{S}$ including a continuous uniform virtual array $\mathcal{W}$ with x-axis distribution from $(-N_x+1)d$ to $(M_x N_x + M_x - 1)dx$ and y-axis distribution from $(-N_y+1)d$ to $(M_y N_y + M_y - 1)d$, wherein there are a total of $V_x \times V_y$ virtual array elements in $\mathcal{W}$ in total, where $V_x = M_x N_x + M_x + N_x - 1$, $V_y = M_y N_y + M_y + N_y - 1$, $\mathcal{W}$ is expressed as:

$$\mathcal{W} = \{(x,y) | x = p_x d, y = p_y d, -N_x + 1 \leq p_x \leq M_x N_x + M_x - 1,$$

$$-N_y + 1 \leq p_y \leq M_y N_y + M_y - 1\}$$

by selecting elements in the equivalent signals $U_r$ corresponding to the positions of the virtual elements of $\mathcal{W}$, the block sample equivalent signals $\tilde{U}_r \in \mathbb{C}^{V_x \times V_y}$ ($r$=1, 2, . . . , R) of the virtual uniform array $\mathcal{W}$ is obtained and expressed as:

$$\tilde{U}_r = \sum_{k=1}^{K} \sigma_k^2 b_x(\theta_k, \varphi_k) \circ b_y(\theta_k, \varphi_k)$$

wherein, $b_x(\theta_k, \varphi_k) = [e^{-j\pi(-N_x+1)\sin(\varphi_k)\cos(\theta_k)}, e^{-j\pi(-N_x+2)\sin(\varphi_k)\cos(\theta_k)}, \ldots, e^{-j\pi(M_x N_x + M_x - 1)\sin(\varphi_k)\cos(\theta_k)}]$ and $b_y(\theta_k, \varphi_k) = [e^{-j\pi(-N_y+1)\sin(\varphi_k)\sin(\theta_k)}, e^{-j\pi(-N_y+2)\sin(\varphi_k)\sin(\theta_k)}, \ldots, e^{-j\pi(M_y N_y + M_y - 1)\sin(\varphi_k)\sin(\theta_k)}]$ are steering vectors of the virtual uniform array $\mathcal{W}$ in x-axis and y-axis directions, which correspond to the $k^{th}$ source with the direction-of-arrival $(\theta_k, \varphi_k)$;

(5) according to the foregoing steps, taking R block samples $T_r$ ($r$=1, 2, . . . , R) sampling blocks to correspondently obtain R coarray signals $\tilde{U}_r$ ($r$=1, 2, . . . , R), and superimposing the R coarray signals $\tilde{U}_r$ ($r$=1, 2, . . . , R) in the third dimension to obtain a coarray tensor $\mathcal{U} \in \mathbb{C}^{V_x \times V_y \times R}$ in whichthe third dimension represents equivalent sampling snapshots; calculating a fourth-order auto-correlation tensor $\tilde{\mathcal{R}} \in \mathbb{C}^{V_x \times V_y \times V_x \times V_y}$ of the block sampling coarray tensor signal $\mathcal{U}$ and expressing it as:

$$\tilde{\mathcal{R}} = \frac{1}{R} \sum_{r=1}^{R} \mathcal{U}(r) \circ \mathcal{U}^*(r),$$

wherein, $\mathcal{U}(r)$ represents a $r^{th}$ slice of $\mathcal{U}$ in the direction of the third dimension (i.e., the equivalent snapshot dimension represented by block sampling);

(6) performing CANDECOMP/PARACFAC decomposition on the fourth-order auto-correlation coarray tensor $\tilde{\mathcal{R}}$ to extract multi-dimension features, the results of which are expressed as follows:

$$\tilde{\mathcal{R}} = \sum_{k=1}^{K} \tilde{b}_x(\theta_k, \varphi_k) \circ \tilde{b}_y(\theta_k, \varphi_k) \circ \tilde{b}_x^*(\theta_k, \varphi_k) \circ \tilde{b}_y^*(\theta_k, \varphi_k),$$

wherein, $\tilde{b}_x(\theta_k, \varphi_k)$ ($k$=1, 2, . . . , K) and $\tilde{b}_y(\theta_k, \varphi_k)$ ($k$=1, 2, . . . , K) are factor vectors obtained by CANDECOMP/PARACFAC decomposition, which represent x-axis direction spatial information and y-axis direction spatial information, respectively; at this time, a theoretical maximum of the number K of the sources, which are distinguishable by the auto-correlation $\tilde{\mathcal{R}}$ CANDECOMP/PARACFAC decomposition, exceeds the actual number of physical array elements; further, a signal subspace $\mathcal{Z}_s \in \mathbb{C}^{V_x V_y \times K}$ is constructed and expressed as:

$$\mathcal{Z}_s = \mathrm{orth}([\tilde{b}_x(\theta_1, \varphi_1) \otimes \tilde{b}_y(\theta_1, \varphi_1), \tilde{b}_x(\theta_2, \varphi_2) \otimes \tilde{b}_y(\theta_2, \varphi_2), \ldots, \tilde{b}_x(\theta_K, \varphi_K) \otimes \tilde{b}_y(\theta_K, \varphi_K)]),$$

wherein, orth($\bullet$) represents a matrix orthogonalization operation; further, $\mathcal{Z}_n \in \mathbb{C}^{V_x V_y \times (V_x V_y - K)}$ represents a noise subspace, then $\mathcal{Z}_s$ and $\mathcal{Z}_n$ have a following relationship:

$$\mathcal{Z}_n \mathcal{Z}_n^H = I - \mathcal{Z}_s \mathcal{Z}_s^H,$$

wherein, I represents a unit matrix; $(\bullet)^H$ represents a conjugate transposition operation; and (7) constructing a tensor spatial spectrum function with enhanced degree-of-freedom according to the obtained signal subspace and the noise subspace, to obtain the spatial spectrum estimation corresponding to the two-dimension direction-of-arrival.

Further, a structure of the coprime planar array described in step (1) can be specifically described as: a pair of spare uniform planar sub-arrays $\mathcal{W}_1$ and $\mathcal{W}_2$ are constructed on a planar coordinate system xoy, wherein $\mathcal{W}_1$ contains $2M_x \times$ 2$M_y$ of antenna array elements, inter-element spacings in the x-axis direction and the y-axis direction are $N_x d$ and $N_y d$, respectively, the position coordinates of which on xoy are $\{(N_x dm_x, N_y dm_y), m_x=0, 1, \ldots, 2M_x-1, m_y=0, 1, \ldots, 2M_y-1\}$; $\mathbb{W}_2$ contains $N_x \times N_y$ of antenna array elements, inter-element spacings in the x-axis direction and the y-axis direction are $M_x d$ and $M_y d$, respectively, the position coordinates of which on xoy are $\{(M_x dn_x, M_y dn_y), n_x=0, 1, \ldots, N_x-1, n_y=0, 1, \ldots, N_y-1\}$; wherein, $M_x$, $N_x$ and $M_y$, $N_y$ are a pair of coprime integers, respectively, and $M_x < N_x$, $M_y < N_y$; $\mathbb{W}_1$ and $\mathbb{W}_2$ are combined in sub-arrays by means of overlapping array elements at the coordinate (0,0), to obtain a coprime planar array that actually contains $4M_x M_y + N_x N_y - 1$ of physical antenna array elements.

Further, the cross-correlation tensor $\tilde{\mathcal{R}}_r$ described in step (3) can be ideally modeled (noise-free scene) as:

$$\mathcal{R}_r = \sum_{k=1}^{K} \sigma_k^2 a_{Mx}(\theta_k,\varphi_k) \circ a_{My}(\theta_k,\varphi_k) \circ a_{Nx}^*(\theta_k,\varphi_k) \circ a_{Ny}^*(\theta_k,\varphi_k),$$

wherein, in $\mathcal{R}_r$, $a_{Mx}(\theta_k,\varphi_k) \circ a_{Nx}^*(\theta_k,\varphi_k)$ is equivalent to an augmented coarray in x-axis; $a_{My}(\theta_k,\varphi_k) \circ a_{Ny}^*(\theta_k,\varphi_k)$ is equivalent to an augmented coarray in y-axis, such that a non-uniform virtual array $\mathcal{S}$ can be obtained.

Further, the coarray signals $\tilde{U}_r$ (r=1, 2, ..., R) corresponding to R block samples $T_r$ (r=1, 2, ..., R) described in step (5) will is constructed, and $\tilde{U}_r$ (r=1, 2, ..., R) is superimposed along the third dimension to obtain a coarray tensor $\mathcal{U} \in \mathbb{C}^{V_x \times V_y \times R}$; the first two dimensions of the coarray tensor $\mathcal{U}$ represent the spatial information of the virtual uniform array in the x-axis and y-axis directions respectively, and the third dimension represents the equivalent snapshots constructed by block sampling; the coarray tensor $\mathcal{U}$ has the same structure as that of the actual received tensor signals $\mathcal{X}_1^{(r)}$ and $\mathcal{X}_2^{(r)}$ of the coprime planar array; for the coarray tensor $\mathcal{U}$, the fourth-order auto-correlation tensor can be directly calculated without need to introduce a spatial smoothing process to compensate for a rank deficient problem caused by a single snapshot of the coarray signals.

Further, the CANDECOMP/PARACFAC decomposition for the fourth-order auto-correlation coarray tensor $\mathcal{R}$ described in step (6) follows a uniqueness condition as follows:

$$k_{rank}(\tilde{B}_x) + k_{rank}(\tilde{B}_y) + k_{rank}(\tilde{B}_x^*) + k_{rank}(\tilde{B}_y^*) \geq 2K+3,$$

wherein, $k_{rank}(\cdot)$ represents Kruskal rank of the matrix, $\tilde{B}_x = [\tilde{b}_x(\theta_1,\varphi_1), \tilde{b}_x(\theta_2,\varphi_2), \ldots, \tilde{b}_x(\theta_K,\varphi_K)]$ and $\tilde{B}_y = [\tilde{b}_y(\theta_1,\varphi_1), \tilde{b}_y(\theta_2,\varphi_2), \ldots, \tilde{b}_y(\theta_K,\varphi_K)]$ denote fact matrices, $k_{rank}(\tilde{B}_x) = \min(V_x, K)$, and $k_{rank}(\tilde{B}_y) = \min(V_y, K)$, $k_{rank}(\tilde{B}_x^*) = \min(V_x, K)$, $k_{rank}(\tilde{B}_y^*) = \min(V_y, K)$, $\min(\cdot)$ presents minimum taking operation; therefore, the uniqueness condition for the CANDECOMP/PARACFAC decomposition is transformed i into:

$$2\min(V_x, K) + 2\min(V_y, K) \geq 2K+3,$$

according to the above inequality, the number K of the distinguishable sources is greater than the number of the actual physical array elements, the maximum value of K is $$\left\lfloor \frac{2(V_x + V_y) - 3}{2} \right\rfloor,$$

$\lfloor \cdot \rfloor$ represents a rounding operation.

Further, the signal and noise subspaces obtained by the fourth-order auto-correlation coarray tensor CANDE-COMP/PARACFAC decomposition are utilized to construct the tensor spatial spectrum function in step (7), a two-dimensional direction-of-arrival $(\tilde{\theta}, \tilde{\varphi})$, $\tilde{\theta} \in [-90°, 90°]$, $\tilde{\varphi} \in [0°, 180°]$ for spectrum peak search are defined at first, and the steering information $\tilde{v}(\tilde{\theta}, \tilde{\varphi}) \in \mathbb{C}^{V_x V_y}$ corresponding to the virtual uniform array $\mathbb{W}$ is constructed, which is expressed as:

$$\tilde{v}(\tilde{\theta},\tilde{\varphi}) = \tilde{b}_x(\tilde{\theta},\tilde{\varphi}) \otimes \tilde{b}_y(\tilde{\theta},\tilde{\varphi})$$

the tensor spatial spectrum function $(\tilde{\theta}, \tilde{\varphi})$ based on the noise subspace is expressed as follows:

$$\mathcal{P}(\tilde{\theta}, \tilde{\varphi}) = \frac{1}{\tilde{v}^H(\tilde{\theta},\tilde{\varphi})(\boldsymbol{z}_n \boldsymbol{z}_n^H)\tilde{v}(\tilde{\theta},\tilde{\varphi})}.$$

thus, the tensor spatial spectrum with enhanced degree-of-freedom corresponding to the two-dimensional search direction-of-arrival $(\tilde{\theta}, \tilde{\varphi})$ is obtained.

Compared with the prior art, the present disclosure has the following advantages:

(1) the present disclosure uses tensors to represent the actual received signal of the coprime planar array, which is different from the traditional method of vectorizing the two-dimensional spatial information and averaging the snapshot information to obtain the second-order statistics. The present disclosure superimposes each sampled snapshot signals in the third dimension, and use the second-order cross-correlation tensor containing four-dimensional spatial information to estimate the spatial spectrum, thereby retaining the multi-dimensional spatial structural information of the actual incident signal of the coprime planar array;

(2) the present disclosure constructs the tensor signal by means of block sampling, and derives the block sampling coarray tensor with equivalent sampling time sequence information. The coarray tensor has the same characteristics as the actual received tensor signals of the coprime planar array, therefore, the fourth-order auto-correlation tensor can be directly derived, without the need to introduce spatial smoothing and other operations to solve the rank deficient problem of the single snapshot coarray signals, which effectively reduces the loss of degree-of-freedom;

(3) the application uses the tensor CANDECOMP/PARACFAC decomposition method to extract the multi-dimensional feature of the fourth-order auto-correlation tensor of the block sampling coarray tensor, thereby establishing the internal connection between the coarray tensor and the signal-to-noise subspace, which provides a basis for constructing a tensor spatial spectrum with enhanced degree-of-freedom.

DESCRIPTION OF EMBODIMENTS

Hereinafter, the technical solution of the present disclosure will be further described in detail with reference to the accompanying drawings.

Figure 1:
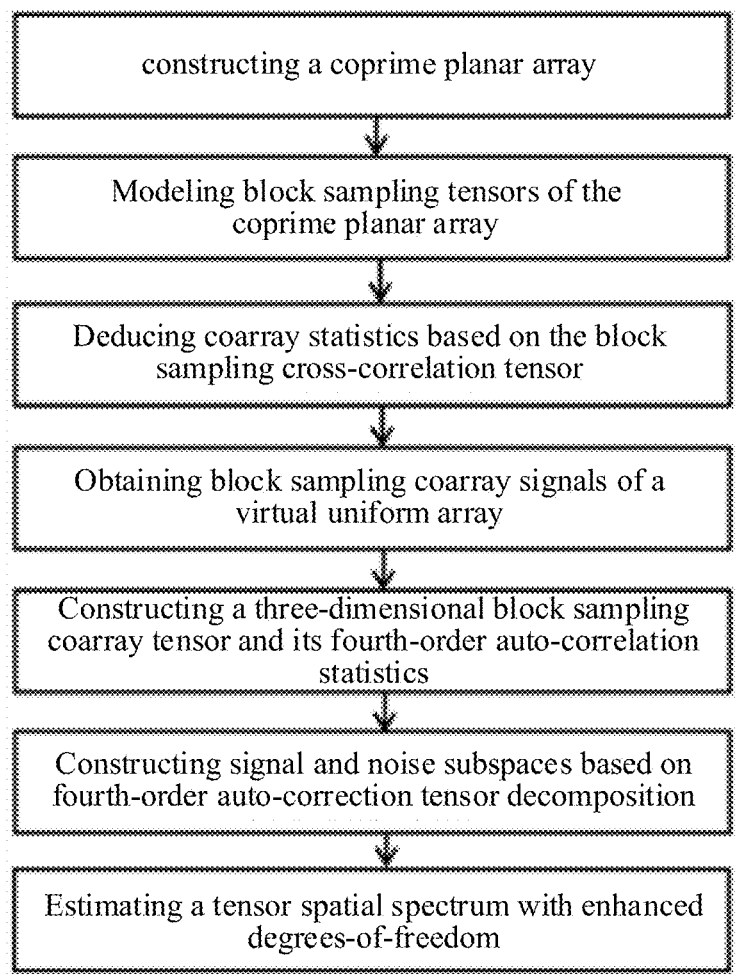
FIG. 1 is a block diagram of the overall flow of the present disclosure.
Figure 2:
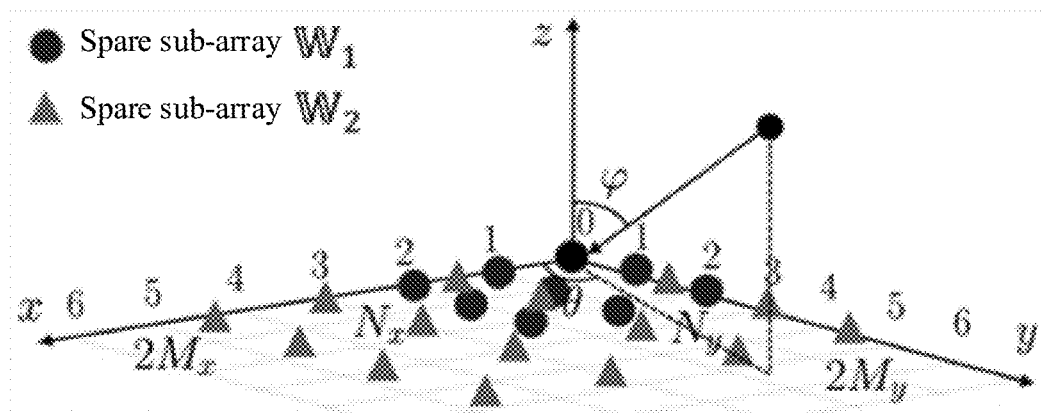
FIG. 2 is a schematic diagram of the structure of the coprime planar array in the present disclosure.

In order to solve the problems of loss of signal multi-dimensional spatial structural information and limited degree-of-freedom performance in existing methods, the present disclosure provides a spatial spectrum estimation method with enhanced degree-of-freedom based on the coprime planar array block sampling tensor construction. Through the statistical analysis of the block sampling tensor of the coprime planar array, the coarray statistics based on the block sampling tensor statistics are derived, and the coarray tensor with equivalent sampling snapshots is constructed; the fourth-order auto-correlation coarray tensor is decomposed by CANDECOMP/PARACFAC to obtain the signal and noise subspaces without need to introduce a spatial smoothing process, thereby constructing the tensor spatial spectrum function with enhanced degree-of-freedom. Referring to FIG. 1, the implementation steps of the present disclosure are as follows:

Step 1: constructing a coprime planar array. At a receiving end, $4M_xM_y+N_xN_y-1$ physical antenna array elements are used to construct a coprime planar array, as shown in FIG. 2: a pair of sparse uniform plane sub-arrays $\mathbb{W}_1$ and $\mathbb{W}_2$ are constructed on the plane coordinate system xoy, where $\mathbb{W}_1$ contains $2M_x \times 2M_y$ antenna array elements, and the inter-elements spacing in the x-axis direction and the y-axis direction are $N_x d$ and $N_y d$, respectively, and the position coordinates on xoy thereof are $\{(N_x d m_x, N_y d m_y), m_x = 0, 1, \ldots, 2M_x-1, m_y=0, 1, \ldots, 2M_y-1\}$; $\mathbb{W}_2$ contains $N_x \times N_y$ antenna array elements, and the inter-elements spacings in the x-axis direction and the y-axis direction are $M_x d$ and $M_y d$, respectively, and the position coordinates on xoy thereof are $\{(M_x d n_x, M_y d n_y), n_x=0, 1, \ldots, N_x-1, n_y=0, 1, \ldots, N_y-1\}$; wherein, $M_x$, $N_x$ and $M_y$, $N_y$ are respectively a pair of coprime integers, and $M_x<N_x$, $M_y<N_y$; the unit spacing d is taken as half of the incident narrowband signal wavelength $\lambda$, that is, $\lambda/2$; $\mathbb{W}_1$ and $\mathbb{W}_2$ are combined in sub-arrays by means of overlapping array elements at the coordinate (0,0), to obtain a coprime planar array that actually contains $4M_xM_y+N_xN_y-1$ of physical antenna array elements;

Step 2: modeling block sampling tensors of a coprime planar array; assuming that there are K far-field narrowband incoherent sources from the direction of $\{(\theta_1,\varphi_1), (\theta_2,\varphi_2), \ldots, (\theta_K,\varphi_K)\}$ and taking L continue time sampling snapshots as a block sample, denoted as $T_r$ (r=1, 2, ..., R), wherein R is the number of block samples; within the sampling range of each block, the sampling snapshot signals of the sparse sub-array $\mathbb{W}_1$ of the coprime planar array are superimposed in the third dimension to obtain a three-dimensional block sampling tensor $\mathcal{X}_1^{(r)} \in \mathbb{C}^{2M_x \times 2M_y \times L}$ (r=1, 2, ..., R), which is expressed as:

$$\mathcal{X}_1^{(r)} = \sum_{k=1}^{K} a_{Mx}(\theta_k, \varphi_k) \circ a_{My}(\theta_k, \varphi_k) \circ s_k + \mathcal{N}_1,$$

wherein, $s_k=[s_{k,1}, s_{k,2}, \ldots, s_{k,L}]^T$ is the multi-snapshot signal waveform corresponding to the $k^{th}$ incident signal source, $[\bullet]^T$ represents a transposition operation, and $\circ$ represents the outer vector product, $\mathcal{N}_1$ is the noise tensor independent of each source, $a_{Mx}(\theta_k,\varphi_k)$ and $a_{My}(\theta_k,\varphi_k)$ are respectively the steering vectors of $\mathbb{W}_1$ in the x-axis and y-axis directions, corresponding to the source with direction-of-arrival $(\theta_k,\varphi_k)$, which are expressed as:

$$a_{Mx}(\theta_k, \varphi_k) = \left[1, e^{-j\pi u_1^{(2)} \sin(\varphi_k)\cos(\theta_k)}, \ldots, e^{-j\pi u_1^{(2M_x)} \sin(\varphi_k)\cos(\theta_k)}\right]^T,$$

$$a_{My}(\theta_k, \varphi_k) = \left[1, e^{-j\pi v_1^{(2)} \sin(\varphi_k)\sin(\theta_k)}, \ldots, e^{-j\pi v_1^{(2M_y)} \sin(\varphi_k)\sin(\theta_k)}\right]^T,$$

wherein $u_1^{(i_1)}$ ($i_1$=1, 2, ..., $2M_x$) and $v_1^{(i_2)}$ ($i_2$=1, 2, ..., $2M_y$) represent the actual positions of the $i_1^{th}$ and $i_2^{th}$ physical antenna array elements of the sparse sub-array $\mathbb{W}_1$ in the x-axis and y-axis directions, respectively, and $u_i^{(1)}=0$, $v_1^{(1)}=0$, $j=\sqrt{-1}$.

Similarly, one block sampling signal of the sparse sub-array $\mathbb{W}_2$ can be represented by another three-dimensional tensor $\mathcal{X}_2^{(r)} \in \mathbb{C}^{N_x \times N_y \times L}$ (r=1, 2, ..., R) as:

$$\mathcal{X}_2^{(r)} = \sum_{k=1}^{K} a_{Nx}(\theta_k, \varphi_k) \circ a_{Ny}(\theta_k, \varphi_k) \circ s_k + \mathcal{N}_2,$$

wherein, $\mathcal{N}_2$ is the noise tensor independent of each source, $a_{Nx}(\theta_k,\varphi_k)$ and $a_{Ny}(\theta_k,\varphi_k)$ are the steering vectors of the sparse sub-array $\mathbb{W}_2$ in the x-axis and y-axis directions respectively, corresponding to the source with direction-of-arrival $(\theta_k,\varphi_k)$, which are expressed as:

$$a_{Nx}(\theta_k, \varphi_k) = \left[1, e^{-j\pi u_2^{(2)} \sin(\varphi_k)\cos(\theta_k)}, \ldots, e^{-j\pi u_2^{(N_x)} \sin(\varphi_k)\cos(\theta_k)}\right]^T,$$

$$a_{Ny}(\theta_k, \varphi_k) = \left[1, e^{-j\pi v_2^{(2)} \sin(\varphi_k)\sin(\theta_k)}, \ldots, e^{-j\pi v_2^{(N_y)} \sin(\varphi_k)\sin(\theta_k)}\right]^T,$$

wherein $u_2^{(i_3)}$ ($i_3$=1, 2, ..., $N_x$) and $v_2^{(i_4)}$ ($i_4$=1, 2, ..., $N_y$) represent the actual positions of the $i_3^{th}$ and $i_4^{th}$ physical antenna array elements of the sparse sub-array $\mathbb{W}_2$ in the x-axis and y-axis directions, respectively, and $u_2^{(1)}=0$, $v_2^{(1)}=0$.

Figure 3:
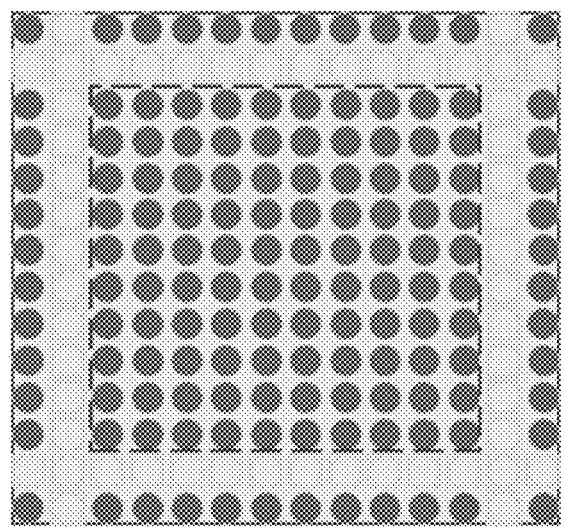
FIG. 3 is a schematic diagram of the structure of an augmented virtual array derived by the present disclosure.

For a block sample $T_r$ (r=1, 2, ..., R), the cross-correlation statistics of the tensor signals $\mathcal{X}_1^{(r)}$ and $\mathcal{X}_2^{(r)}$ (r=1, 2, ..., R) of the sub-arrays $\mathbb{W}_1$ and $\mathbb{W}_2$ within the block sampling range are calculated to obtain a second-order cross-correlation tensor $\hat{\mathcal{R}}_r \in \mathbb{C}^{2M_x \times 2M_y \times N_x \times N_y}$ (r=1, 2, ..., R) with four-dimensional space information, which is expressed as:

$$\hat{\mathcal{R}}_r = \frac{1}{L} \sum_{l=1}^{L} \mathcal{X}_1^{(r)}(l) \circ \mathcal{X}_2^{(r)*}(l),$$

wherein, $\mathcal{X}_1^{(r)}(l)$ and $\mathcal{X}_2^{(r)}(l)$ respectively represent the $l^{th}$ slice of $\mathcal{X}_1^{(r)}$ and $\mathcal{X}_2^{(r)}$ in the direction of the third dimension (i.e., snapshot dimension), and $(\bullet)^*$ represents a conjugation operation;

Step 3: deducing coarray signals based on the cross-correlation statistics of the block sampling tensor signals. The second-order cross-correlation tensor $\mathbb{C}_r$ of the bock sampling received tensor signal of the two sub-arrays in the coprime planar array can be ideally modeled (noise-free scene) as:

$$\mathcal{R}_r = \sum_{k=1}^{K} \sigma_k^2 a_{Mx}(\theta_k,\varphi_k) \circ a_{My}(\theta_k,\varphi_k) \circ a_{Nx}^*(\theta_k,\varphi_k) \circ a_{Ny}^*(\theta_k,\varphi_k),$$

wherein, $\sigma_k^2$ represents the power of the $k^{th}$ incident signal source; at this time, in $\mathcal{R}_r$, $a_{Mx}(\theta_k,\varphi_k) \circ a_{Nx}^*(\theta_k,\varphi_k)$ is equivalent to an augmented virtual domain along the x-axis, and $a_{My}(\theta_k,\varphi_k) \circ a_{Ny}^*(\theta_k,\varphi_k)$ is equivalent to an augmented virtual domain along the y-axis, thus an augmented non-uniform virtual array $S$ can be obtained as shown in FIG. 3, where the position of each virtual array element is expressed as:

$$S = \{(-M_x n_x d + N_x m_x d, -M_y n_y d + N_y m_y d) | 0 \leq n_x \leq N_x - 1,$$
$$0 \leq m_x \leq 2M_x - 1, 0 \leq n_y \leq N_y - 1, 0 \leq m_y \leq 2M_y - 1\}.$$

In order to obtain the equivalent signals corresponding to the augmented virtual array, the first and third dimensions representing the spatial information of x-axis direction in the cross-correlation tensor $\mathcal{R}_r$ are merged into one dimension, and the second and fourth dimensions representing the spatial information of y-axis direction are merged into another dimension. The dimensional merging of tensors can be realized through the PARAFAC-based unfolding. Taking a four-dimensional tensor $\mathcal{B} \in \mathbb{C}^{I_1 \times I_2 \times I_3 \times I_4} = \sum_{p=1}^{P} b_{11} \circ b_{12} \circ b_{21} \circ b_{22}$ as an example, the dimension sets $\mathbb{T}_1 = \{1, 2\}$ and $\mathbb{T}_2 = \{3, 4\}$ are defined, then the modulo $\{\mathbb{T}_1, \mathbb{T}_2\}$ PARAFAC-based unfolding of $\mathcal{B}$ is as follows:

$$B \in \mathbb{C}^{I_1 I_2 \times I_3 I_4} \triangleq \mathcal{B}_{\{\mathbb{T}_1, \mathbb{T}_2\}} = \sum_{p=1}^{P} b_1 \circ b_2,$$

wherein, the tensor subscript represents the tensor PARAFAC-based unfolding, $b_1 = b_{12} \otimes b_{11}$ and $b_2 = b_{22} \otimes b_{21}$ represent the factor vectors of the two dimensions after unfolding; wherein, $\otimes$ represents the Kronecker product. Therefore, the dimensional sets $\mathbb{J}_1 = \{1, 3\}$ and $\mathbb{J}_2 = \{2, 4\}$ are defined, and an equivalent received signal $U_r \in \mathbb{C}^{2M_x N_x \times 2M_y N_y}$ ($r=1, 2, \ldots, R$) of the augmented virtual arrays can be obtained by modulo $\{\mathbb{J}_1, \mathbb{J}_2\}$ PARAFAC-based unfolding on the cross-correlation tensor $\mathcal{R}_r$, which is expressed as:

$$U_r \triangleq \mathcal{R}_{r\{\mathbb{J}_1, \mathbb{J}_2\}} = \sum_{k=1}^{K} \sigma_k^2 a_x(\theta_k, \varphi_k) \circ a_y(\theta_k, \varphi_k),$$

wherein, $a_x(\theta_k, \varphi_k) = a_{Nx}^*(\theta_k, \varphi_k) \otimes a_{Mx}(\theta_k, \varphi_k)$ and $a_y(\theta_k, \varphi_k) = a_{Ny}^*(\theta_k, \varphi_k) \otimes a_{My}(\theta_k, \varphi_k)$ are steering vectors of the augmented virtual array $S$ along in x-axis and y-axis directions, which correspond to the $k^{th}$ signal source with direction-of-arrival $(\theta_k, \varphi_k)$;

Step 4: obtaining the block sampling coarray signals of a virtual uniform array. $S$ includes a virtual uniform array $\mathbb{W}$ with x-axis distribution from $(-N_x+1)d$ to $(M_x N_x + M_x - 1)d$ and y-axis distribution from $(-N_y+1)d$ to $(M_y N_y + M_y - 1)d$. There are a total of $V_x \times V_y$ virtual elements in $\mathbb{W}$, where $V_x = M_x N_x + M_x + N_x - 1$, $V_y = M_y N_y + M_y + N_y - 1$; the structure of the virtual uniform array $\mathbb{W}$ is shown in the dotted box in FIG. 3, and is expressed as:

$$\mathbb{W} = \{(x, y) | x = p_x d, y = p_y d, -N_x + 1 \leq p_x \leq M_x N_x + M_x - 1,$$
$$-N_y + 1 \leq p_y \leq M_y N_y + M_y - 1\}.$$

By selecting the elements in the equivalent signals $U_r$ corresponding to the positions of the virtual elements of $\mathbb{W}$ of the augmented virtual array $S$, the block sampling equivalent signals $\tilde{U}_r \in \mathbb{C}^{V_x \times V_y}$ ($r=1, 2, \ldots, R$) of the virtual uniform array $\mathbb{W}$ can be obtained:

$$\tilde{U}_r = \sum_{k=1}^{K} \sigma_k^2 b_x(\theta_k, \varphi_k) \circ b_y(\theta_k, \varphi_k),$$

wherein,
$b_x(\theta_k, \varphi_k) = [e^{-j\pi(-N_x+1)\sin(\varphi_k)\cos(\theta_k)}, e^{-j\pi(-N_x+2)\sin(\varphi_k)\cos(\theta_k)}, \ldots, e^{-j\pi(M_x N_x + M_x - 1)\sin(\varphi_k)\cos(\theta_k)}]$ and
$b_y(\theta_k, \varphi_k) = [e^{-j\pi(-N_y+1)\sin(\varphi_k)\sin(\theta_k)}, e^{-j\pi(-N_y+2)\sin(\varphi_k)\cos(\theta_k)}, \ldots, e^{-j\pi(M_y N_y + M_y - 1)\sin(\varphi_k)\sin(\theta_k)}]$ are steering vectors of the virtual uniform array in the x-axis and y-axis directions, corresponding to the $k^{th}$ source with the direction-of-arrival $(\theta_k, \varphi_k)$;

Step 5: constructing a three-dimensional block sampling coarraytensor and its fourth-order auto-correlation statistics. According to the foregoing steps, R block samples $T_r$ ($r=1, 2, \ldots, R$) are taken to correspondingly obtain R coarray signals $\tilde{U}_r$ ($r=1, 2, \ldots, R$) and these R coarray signals $\tilde{U}_r$ are superimposed in the third dimension to obtain a three-dimensional tensor $\mathcal{U} \in \mathbb{C}^{V_x \times V_y \times R}$. The first two dimensions of the coarray tensor $\mathcal{U}$ represent the spatial information of the virtual uniform array in the x-axis and y-axis directions, and the third dimension represents the equivalent snapshots constructed by block sampling. It can be seen that the coarray tensor $\mathcal{U}$ has the same structure as that of the coprime planar array which actually receives tensor signals $\mathcal{X}_1^{(r)}$ and $\mathcal{X}_2^{(r)}$. For the coarray tensor $\mathcal{U}$, the fourth-order auto-correlation tensor can be directly calculated, without the need to introduce a spatial smoothing process to compensate for the rank deficiency problem caused by the single-block shooting of the coarray signals. The fourth-order auto-correlation tensor $\tilde{\mathcal{R}} \in \mathbb{C}^{V_x \times V_y \times V_x \times V_y}$ of the block sampling coarray tensor $\mathcal{U}$ is calculated and expressed as:

$$\tilde{\mathcal{R}} = \frac{1}{R} \sum_{r=1}^{R} \mathcal{U}(r) \circ \mathcal{U}^*(r),$$

wherein, $\mathcal{U}(r)$ represents the $r^{th}$ slice of $\mathcal{U}$ in the direction of the third dimension (i.e., the equivalent snapshot dimension represented by block sampling);

Step 6: constructing the signal-to-noise subspace based on the fourth-order auto-correlation coarray tensor decomposition. In order to construct the tensor spatial spectrum, the fourth-order auto-correlation tensor $\tilde{\mathcal{R}}$ is subjected to CANDECOMP/PARACFAC decomposition to extract multi-dimensional features, and the result is expressed as follows:

$$\tilde{\mathcal{R}} = \sum_{k=1}^{K} \tilde{b}_x(\theta_k, \varphi_k) \circ \tilde{b}_y(\theta_k, \varphi_k) \circ \tilde{b}_x^*(\theta_k, \varphi_k) \circ \tilde{b}_y^*(\theta_k, \varphi_k),$$

wherein, $\tilde{b}_x(\theta_k, \varphi_k)$ ($k=1, 2, \ldots, K$) and $\tilde{b}_y(\theta_k, \varphi_k)$ ($k=1, 2, \ldots, K$) are the factor vectors obtained by CANDECOMP/PARACFAC decomposition, which respectively represent the spatial information in the x-axis direction and the y-axis direction; $\tilde{B}_x = [\tilde{b}_x(\theta_1, \varphi_1), \tilde{b}_x(\theta_2, \varphi_2), \ldots, \tilde{b}_x(\theta_K, \varphi_K)]$ and $\tilde{B}_y = [\tilde{b}_y(\theta_1, \varphi_1), \tilde{b}_y(\theta_2, \varphi_2), \ldots, \tilde{b}_y(\theta_K, \varphi_K)]$ represent the factor sub-matrices. At this time, CANDECOMP/PARACFAC decomposition follows the uniqueness condition as follows:

$$\mathcal{k}_{rank}(\tilde{B}_x) + \mathcal{k}_{rank}(\tilde{B}_y) + \mathcal{k}_{rank}(\tilde{B}_x^*) + \mathcal{k}_{rank}(\tilde{B}_y^*) \geq 2K+3,$$

wherein, $\mathcal{k}_{rank}(\cdot)$ represents the Kruskal rank of the matrix, and $\mathcal{k}_{rank}(\tilde{B}_x) = \min(V_x, K)$, $\mathcal{k}_{rank}(\tilde{B}_y) = \min(V_y, K)$, $\mathcal{k}_{rank}(\tilde{B}_x^*) = \min(V_x, K)$, $\mathcal{k}_{rank}(\tilde{B}_y^*) = \min(V_y, K)$, and $\min(\cdot)$ represents the minimum operation. Therefore, the above unique decomposition conditions can be transformed into:

$$2\min(V_x, K) + 2\min(V_y, K) \geq 2K+3.$$

It can be seen from the above inequality that the number of distinguishable incident sources K of the method proposed in the present disclosure is greater than the number of actual physical array elements, and the maximum value of K is $$\left\lfloor \frac{2(V_x + V_y) - 3}{2} \right\rfloor,$$

and ⌊•⌋ represents a rounding operation. Furthermore, the multi-dimensional features obtained by tensor decomposition are used to construct the signal subspace $\mathbb{W}_2 \in \mathbb{C}^{V_x V_y \times K}$:

$$\mathbb{W}_2 = \text{orth}([\tilde{b}_x(\theta_1,\varphi_1) \otimes \tilde{b}_y(\theta_1,\varphi_1), \tilde{b}_x(\theta_2,\varphi_2) \otimes \tilde{b}_y(\theta_2,\varphi_2), \ldots, \tilde{b}_x(\theta_K,\varphi_K) \otimes \tilde{b}_y(\theta_K,\varphi_K)]),$$

wherein, orth(•) represents the matrix orthogonalization operation; $\mathbb{W}_n \in \mathbb{C}^{V_x V_y \times (V_x V_y - K)}$ represents the noise subspace, then $\mathbb{W}_s$ and $\mathbb{W}_n$ have the following relationship:

$$\mathbb{W}_n \mathbb{W}_n^H = I - \mathbb{W}_s \mathbb{W}_s^H,$$

wherein, I represents the unit matrix; $(•)^H$ represents the conjugate transposition operation;

Step 7: estimating a tensor spatial spectrum with enhanced degree-of-freedom. The two-dimensional directions of arrival $(\tilde{\theta}, \tilde{\varphi})$, $\tilde{\theta} \in [-90°, 90°]$, $\tilde{\varphi} \in [0°, 180°]$ for spectrum peak search are defined and the steering information $\tilde{v}(\tilde{\theta},\tilde{\varphi}) \in \mathbb{C}^{V_x V_y}$ corresponding to the virtual uniform array $\mathbb{W}$ is constructed, which is expressed as:

$$\tilde{v}(\tilde{\theta},\tilde{\varphi}) = b_x(\tilde{\theta},\tilde{\varphi}) \otimes b_y(\tilde{\theta},\tilde{\varphi}).$$

The tensor spatial spectrum function $\mathcal{F}(\tilde{\theta}, \tilde{\varphi})$ based on the noise subspace is expressed as follows:

$$\mathcal{P}(\tilde{\theta}, \tilde{\varphi}) = \frac{1}{\tilde{v}^H(\tilde{\theta},\tilde{\varphi}) \mathbb{W}_n \mathbb{W}_n^H \tilde{v}(\tilde{\theta},\tilde{\varphi})},$$

thus, the tensor spatial spectrum with enhanced degree-of-freedom corresponding to the two-dimensional search direction-of-arrival $(\tilde{\theta}, \tilde{\varphi})$ is obtained.

In summary, the present disclosure fully considers the multi-dimensional information structure of the coprime planar array signal, uses block sampling tensor signal modeling, constructs a virtual domain tensor signal with equivalent sampling time sequence information, and further uses tensor decomposition to extract the multi-dimensional feature of the fourth-order statistics of the block sampling coarray tensor to construct a signal-to-noise subspace based on the block sampling coarray tensor, and establish the correlation between the block sampling coarray tensor signal and the tensor spatial spectrum of the coprime planar array; at the same time, the present disclosure obtains a coarray tensor with a three-dimensional information structure through the block sample construction, thereby avoiding the need of the introduction of a spatial smoothing process in order to solve the rank deficiency problem resulting from single-block shooting of the coarray signals; therefore, the advantages of the degree-of-freedom brought by the virtual domain of the coprime planar array are sufficiently utilized and the multi-source tensor spatial spectrum estimation with enhanced degree of freedom is realized.

The above are only the preferred embodiments of the present disclosure. Although the present disclosure has been disclosed as above in preferred embodiments, it is not intended to limit the present disclosure. Anyone skilled in the art, without departing from the scope of the technical solution of the present disclosure, can use the methods and technical content disclosed above to make many possible changes and modifications to the technical solution of the present disclosure, or modify it into equivalent changes. Therefore, all simple variations, equivalent changes and modifications made to the above embodiments based on the technical essence of the present disclosure without departing from the content of the technical solution of the present disclosure still fall within the protection scope of the technical solution of the present disclosure.

What is claimed is:

1. A spatial spectrum estimation method with enhanced degree-of-freedom based on block sampling tensor construction for coprime planar array, characterized by comprising steps of:

(1) constructing, by a receiving end, an architecture using $4M_x M_y + N_x N_y - 1$ physical antenna array elements according to the structure of the coprime planar array; wherein, $M_x$, $N_x$ and $M_y$, $N_y$ are a pair of coprime integers, respectively, and $M_x < N_x$, $M_y < N_y$; and the coprime array can be decomposed into two sparse uniform sub-arrays $\mathbb{W}_1$ and $\mathbb{W}_2$;

(2) assuming that there are K far-field narrowband incoherent sources from direction-of-arrival $\{(\theta_1,\varphi_1), (\theta_2,\varphi_2), \ldots, (\theta_K,\varphi_K)\}$ taking L sample snapshots as one block sample, denoted as $T_r$ (r=1, 2, ..., R), R denoting a number of the block samples; wherein, within a sampling range of each block, the received signals of a sparse sub-array $\mathbb{W}_1$ of the coprime planar can be represented by one three-dimensional tensor $\mathcal{X}_1^{(r)} \in \mathbb{C}^{2M_x \times 2M_y \times L}$ (r=1, 2, ..., R) as:

$$\mathcal{X}_1^{(r)} = \sum_{k=1}^{K} a_{Mx}(\theta_k, \varphi_k) \circ a_{My}(\theta_k, \varphi_k) \circ s_k + \mathcal{N}_1,$$

wherein, $s_k = [s_{k,1}, s_{k,2}, \ldots, s_{k,L}]^T$ is a multiple-snapshot signal waveform corresponding to the $k^{th}$ incident signal source, $[•]^T$ represents the transposition operation, $\circ$ represents a vector outer product, $\mathcal{N}_1$ is a noise tensor independent of each signal source, $a_{Mx}(\theta_k,\varphi_k)$ and $a_{My}(\theta_k,\varphi_k)$ are steering vectors of $\mathbb{W}_1$ in x-axis and y-axis directions, respectively, which correspond to the $k^{th}$ source with a direction-of-arrival $(\theta_k,\varphi_k)$ and are expressed as:

$$a_{Mx}(\theta_k, \varphi_k) = \left[1, e^{-j\pi u_1^{(2)} \sin(\varphi_k)\cos(\theta_k)}, \ldots, e^{-j\pi u_1^{(2M_x)} \sin(\varphi_k)\cos(\theta_k)}\right]^T,$$

$$a_{My}(\theta_k, \varphi_k) = \left[1, e^{-j\pi v_1^{(2)} \sin(\varphi_k)\sin(\theta_k)}, \ldots, e^{-j\pi v_1^{(2M_y)} \sin(\varphi_k)\sin(\theta_k)}\right]^T,$$

wherein, $u_1^{(i_1)}$ ($i_1=1, 2, \ldots, 2M_x$) and $v_1^{(i_2)}$ ($i_2=1, 2, \ldots, 2M_y$) represent actual positions of $i_1^{th}$ and $i_2^{th}$ physical antenna array elements of the sparse sub-array $\mathbb{W}_1$ in the x-axis and y-axis directions, respectively, and $u_1^{(1)}=0$, $v_1^{(1)}=0$, $j=\sqrt{-1}$;

within the sampling range of each block, the received signals of the sparse sub-array $\mathbb{W}_2$ can be represented by another three-dimensional tensor $\mathcal{X}_2^{(r)} \in \mathbb{C}^{N_x \times N_y \times L}$ (r=1, 2, ..., R) as:

$$\mathcal{X}_2^{(r)} = \sum_{k=1}^{K} a_{Nx}(\theta_k, \varphi_k) \circ a_{Ny}(\theta_k, \varphi_k) \circ s_k + \mathcal{N}_2,$$

wherein, $\mathcal{N}_2$ is a noise tensor independent of each source, $a_{Nx}(\theta_k,\varphi_k)$ and $a_{Ny}(\theta_k,\varphi_k)$ are the steering vectors of the sparse sub-array $\mathbb{W}_2$ in the x-axis and y-axis directions, respectively, which correspond to the $k^{th}$ source with direction-of-arrival $(\theta_k,\varphi_k)$ and are expressed as:

$$a_{N_x}(\theta_k, \varphi_k) = \left[1, \ e^{-j\pi u_2^{(2)}\sin(\varphi_k)\cos(\theta_k)}, \ldots, \ e^{-j\pi u_2^{(N_x)}\sin(\varphi_k)\cos(\theta_k)}\right]^T,$$

$$a_{N_y}(\theta_k, \varphi_k) = \left[1, \ e^{-j\pi v_2^{(2)}\sin(\varphi_k)\sin(\theta_k)}, \ldots, \ e^{-j\pi v_2^{(N_y)}\sin(\varphi_k)\sin(\theta_k)}\right]^T,$$

wherein, $u_2^{(i_3)}$ ($i_3=1, 2, \ldots, N_x$) and $v_2^{(i_4)}$ ($i_4=1, 2, \ldots, N_y$) represent actual positions of the $i_3^{th}$ and $i_4^{th}$ physical antenna array elements of the sparse sub-array $\mathbb{W}_2$ in the x-axis and y-axis directions, respectively, and $u_2^{(1)}=0$, $v_2^{(1)}=0$;

for one block sample $T_r$ ($r=1, 2, \ldots, R$), a second-order cross-correlation tensor $\hat{\mathcal{R}}_r \in \mathbb{C}^{2M_x \times 2M_y \times N_x \times N_y}$ ($r=1, 2, \ldots, R$) of the received tensor signals $\mathcal{X}_1^{(r)}$ and $\mathcal{X}_2^{(r)}$ ($r=1, 2, \ldots, R$) of the sub-arrays $\mathbb{W}_1$ and $\mathbb{W}_2$ within the block sampling range is calculated, which is expressed as:

$$\hat{\mathcal{R}}_r = \frac{1}{L}\sum_{l=1}^{L} \mathcal{X}_1^{(r)}(l) \circ \mathcal{X}_2^{(r)*}(l),$$

wherein, $\mathcal{X}_1^{(r)}(l)$ and $\mathcal{X}_2^{(r)}(l)$ respectively represent a $l^{th}$ slice in a direction of a third dimension (i.e., snapshot dimension), and $(\bullet)^*$ represents a conjugation operation;

(3) obtaining an augmented non-uniform virtual array $\mathcal{S}$ from the cross-correlation tensor $\hat{\mathcal{R}}_r$, wherein a position of each virtual array element is expressed as:

$\mathcal{S} = \{(-M_x n_x d + N_x m_x d, -M_y n_y d + N_y m_y d) | 0 \le n_x \le N_x - 1,$
$0 \le m_x \le 2M_x - 1, 0 \le n_y \le N_y - 1, 0 \le m_y \le 2M_y - 1\}$ wherein, a unit spacing d is taken as half of an incident narrowband signal wavelength $\lambda$, that is, $d=\lambda/2$; dimensional sets $\mathbb{J}_1 = \{1, 3\}$ and $\mathbb{J}_2 = \{2, 4\}$ are defined, then the equivalent signals $U_r \in \mathbb{C}^{2M_x \times N_x \times 2M_y N_y}$ ($r=1, 2, \ldots, R$) of the augmented virtual array $\mathcal{S}$ can be obtained by modulo $\{\mathbb{J}_1, \mathbb{J}_2\}$ PARAFAC-based unfolding on the ideal value $\mathcal{R}_r$ (noise-free scene) of the cross-correlation tensor $\mathcal{R}_r$, which is ideally expressed as:

$$U_r \triangleq \mathcal{R}_{r_{[\mathbb{J}_1, \mathbb{J}_2]}} = \sum_{k=1}^{K} \sigma_k^2 a_x(\theta_k, \varphi_k) \circ a_y(\theta_k, \varphi_k)$$

wherein, $a_x(\theta_k, \varphi_k) = a_{N_x}^*(\theta_k, \varphi_k) \otimes a_{M_x}(\theta_k, \varphi_k)$ and $a_y(\theta_k, \varphi_k) = a_{N_y}^*(\theta_k, \varphi_k) \otimes a_{M_y}(\theta_k, \varphi_k)$ are steering vectors of the augmented virtual array $\mathcal{S}$ in the x-axis and y-axis directions, which correspond to the $k^{th}$ source with direction-of-arrival $(\theta_k, \varphi_k)$; $\sigma_k^2$ represents the power of the $k^{th}$ incident source; wherein, $\otimes$ represents a Kronecker product; and the tensor subscripts represent PARAFAC-based tensor unfolding;

(4) $\mathcal{S}$ comprising a continuous uniform virtual array $\mathcal{W}$ with x-axis distribution from $(-N_x+1)d$ to $(M_x N_x + M_x - 1)d$ and y-axis distribution from $(-N_y+1)d$ to $(M_y N_y + M_y - 1)d$ in, wherein there are a total of $V_x \times V_y$ virtual array elements in $\mathcal{W}$, where $V_x = M_x N_x + M_x + N_x - 1$, $V_y = M_y N_y + M_y + N_y - 1$, $\mathcal{W}$ is expressed as:

$\mathcal{W} = \{(x,y) | x = p_x d, y = p_y d, -N_x + 1 \le p_x \le M_x N_x + M_x - 1,$ $-N_y + 1 \le p_y \le M_y N_y + M_y - 1\}$ by selecting the elements in the coarray signals $U_r$ corresponding to the positions of the virtual elements of $\mathcal{W}$, the block sampling equivalent signals $\tilde{U}_r \in \mathbb{C}^{V_x \times V_y}$ ($r=1, 2, \ldots, R$) of the virtual uniform array $\mathcal{W}$ is obtained and expressed as:

$$\tilde{U}_r = \sum_{k=1}^{K} \sigma_k^2 b_x(\theta_k, \varphi_k) \circ b_y(\theta_k, \varphi_k),$$

where
$b_x(\theta_k, \varphi_k) = [e^{-j\pi(-N_x+1)\sin(\varphi_k)\cos(\theta_k)},$
$e^{-j\pi(-N_x+2)\sin(\varphi_k)\cos(\theta_k)}, \ldots, e^{-j\pi(M_x N_x + M_x - 1)\sin(\varphi_k)\cos(\theta_k)}]$
and
$b_y(\theta_k, \varphi_k) = [e^{-j\pi(-N_y+1)\sin(\varphi_k)\sin(\theta_k)},$
$e^{-j\pi(-N_y+2)\sin(\varphi_k)\sin(\theta_k)}, \ldots, e^{-j\pi(M_y N_y + M_y - 1)\sin(\varphi_k)\sin(\theta_k)}]$
are steering vectors of the virtual uniform array $\mathcal{W}$ in x-axis and y-axis directions, which correspond to the $k^{th}$ source with the direction-of-arrival $(\theta_k, \varphi_k)$;

(5) according to the foregoing steps, taking R block samples $T_r$ ($r=1, 2, \ldots, R$) to correspondently obtain R coarray signals $\tilde{U}_r$ ($r=1, 2, \ldots, R$), and superimposing the R coarray signals $\tilde{U}_r$ ($r=1, 2, \ldots, R$) in the third dimension to obtain a coarray tensor $\mathcal{U} \in \mathbb{C}^{V_x \times V_y \times R}$ in which the third dimension represents equivalent sampling snapshots; calculating a fourth-order autocorrelation tensor $\tilde{\mathcal{R}} \in \mathbb{C}^{V_x \times V_y \times V_x \times V_y}$ of the block sampling coarray tensor signal $\mathcal{U}$ and expressing it as:

$$\tilde{\mathcal{R}} = \frac{1}{R}\sum_{r=1}^{R} \mathcal{U}(r) \circ \mathcal{U}^*(r),$$

wherein, $\mathcal{U}(r)$ represents the $r^{th}$ slice of $\mathcal{U}$ in a direction of the third dimension (i.e., the equivalent sampling snapshot dimension represented by block sampling);

(6) performing CANDECOMP/PARACFAC decomposition on the fourth-order auto-correlation coarray tensor $\tilde{\mathcal{R}}$ to extract multi-dimension features, the results of which are expressed as follows:

$\tilde{\mathcal{R}} = \sum_{k=1}^{K} \tilde{b}_x(\theta_k, \varphi_k) \circ \tilde{b}_y(\theta_k, \varphi_k) \circ \tilde{b}_x^*(\theta_k, \varphi_k) \circ \tilde{b}_y^*(\theta_k, \varphi_k),$ wherein, $\tilde{b}_x(\theta_k, \varphi_k)$ ($k=1, 2, \ldots, K$) and $\tilde{b}_y(\theta_k, \varphi_k)$ ($k=1, 2, \ldots, K$) are factor vectors obtained by CANDECOMP/PARACFAC decomposition, which represent x-axis direction spatial information and y-axis direction spatial information, respectively; at this time, a theoretical maximum of the number K of the signal sources, which are distinguishable by the auto-correlation $\tilde{\mathcal{R}}$ CANDECOMP/PARACFAC decomposition, exceeds the actual number of physical array elements; further, a noise subspace $\mathcal{Z}_s \in \mathbb{C}^{V_x V_y \times K}$ is constructed and expressed as:

$\mathcal{Z}_s = \text{orth}([\tilde{b}_x(\theta_1, \varphi_1) \otimes \tilde{b}_y(\theta_1, \varphi_1), \tilde{b}_x(\theta_2, \varphi_2) \otimes \tilde{b}_y$
$(\theta_2, \varphi_2), \ldots, \tilde{b}_x(\theta_K, \varphi_K) \otimes \tilde{b}_y(\theta_K, \varphi_K)]),$ wherein, $\text{orth}(\bullet)$ represents a matrix orthogonalization operation; further, $\mathcal{Z}_n \in \mathbb{C}^{V_x V_y \times (V_x V_y - K)}$ represents a noise subspace, then $\mathcal{Z}_s$ and $\mathcal{Z}_n$ have a following relationship:

$\mathcal{Z}_n \mathcal{Z}_n^H = I - \mathcal{Z}_s \mathcal{Z}_s^H,$ wherein, $I$ represents a unit matrix; $(\bullet)^H$ represents a conjugate transposition operation;

(7) constructing a tensor spatial spectrum function with enhanced degree-of-freedom according to the obtained signal subspace and the noise subspace, to obtain the spatial spectrum estimation corresponding to the two-dimensional direction-of-arrival.

2. The spatial spectrum estimation method with enhanced degree-of-freedom based on block sampling tensor construction for coprime planar array of claim 1, wherein a structure of the coprime planar array described in step (1) can be described as: a pair of spare uniform planar sub-arrays $\mathbb{W}_1$ and $\mathbb{W}_2$ are constructed on a planar coordinate system xoy, wherein $\mathbb{W}_1$ contains $2M_x \times 2M_y$ antenna array elements, inter-element spacings in the x-axis direction and the y-axis direction are $N_x d$ and $N_y d$, respectively, the position coordinates of which on xoy are $\{(N_x dm_x, N_y dm_y), m_x=0, 1, \ldots, 2M_x-1, m_y=0, 1, \ldots, 2M_y-1\}$; $\mathbb{W}_2$ contains $N_x \times N_y$ antenna array elements, inter-element spacings in the x-axis direction and the y-axis direction are $M_x d$ and $M_y d$, respectively, the position coordinates of which on xoy are $\{(M_x dn_x, M_y dn_y), n_x=0, 1, \ldots, N_x-1, n_y=0, 1, \ldots, N_y-1\}$; wherein, $M_x$, $N_x$ and $M_y$, $N_y$ are a pair of coprime integers, respectively, and $M_x < N_x$, $M_y < N_y$; $\mathbb{W}_1$ and $\mathbb{W}_2$ are combined in sub-arrays by means of overlapping array elements at the coordinate (0,0), to obtain a coprime planar array that actually contains $4M_x M_y + N_x N_y - 1$ physical antenna array elements.

3. The spatial spectrum estimation method with enhanced degree-of-freedom based on block sampling tensor construction for coprime planar array of claim 1, wherein the cross-correlation tensor $\mathcal{R}_r$ described in step (3) can be ideally modeled as (noise-free scene):

$$\mathcal{R}_r = \sum_{k=1}^{K} \sigma_k^2 a_{M_x}(\theta_k, \varphi_k) \circ a_{M_y}(\theta_k, \varphi_k) \circ a_{N_x}^*(\theta_k, \varphi_k) \circ a_{N_y}^*(\theta_k, \varphi_k),$$

wherein, in $\mathcal{R}_r$, $a_{M_x}(\theta_k,\varphi_k) \circ a_{N_x}^*(\theta_k,\varphi_k)$ is equivalent to an augmented coarray along the x-axis; $a_{M_y}(\theta_k,\varphi_k) \circ a_{N_y}^*(\theta_k,\varphi_k)$ is equivalent to an augmented coarray along the y-axis, such that a non-uniform virtual array $\mathcal{S}$ can be obtained.

4. The spatial spectrum estimation method with enhanced degree-of-freedom based on block sampling tensor construction for coprime planar array of claim 1, wherein as described in step (5), the coarray signals $\tilde{U}_r$ ($r=1, 2, \ldots, R$) corresponding to R block samples $T_r$ ($r=1, 2, \ldots, R$) is constructed, and $\tilde{U}_r$ ($r=1, 2, \ldots, R$) is superimposed along the third dimension to obtain a coarray tensor $\mathcal{U} \in \mathbb{C}^{V_x \times V_y \times R}$; the first two dimensions of the coarray tensor $\mathcal{U}$ represent the spatial information of the virtual uniform array in x-axis and y-axis directions; the third dimension represents the equivalent sampling snapshot constructed by block sampling; the coarray tensor $\mathcal{U}$ has the same structure as that of the actual received tensor signals $\mathcal{X}_1^{(r)}$ and $\mathcal{X}_2^{(r)}$ of the coprime planar array; for the coarray tensor $\mathcal{U}$, the fourth-order auto-correlation tensor can be directly calculated without need to introduce spatial smoothing process to compensate for a rank deficient problem caused by a single snapshot of the coarray signals.

5. The spatial spectrum estimation method with enhanced degree-of-freedom based on block sampling tensor construction for coprime planar array of claim 1, wherein the CANDECOMP/PARACFAC decomposition for the fourth-order auto-correlation tensor $\mathcal{R}$ described in step (6) follows a uniqueness condition as follows:

$$k_{rank}(\tilde{B}_x) + k_{rank}(\tilde{B}_y) + k_{rank}(\tilde{B}_x^*) + k_{rank}(\tilde{B}_y^*) \geq 2K+3,$$

wherein, $k_{rank}(\cdot)$ represents Kruskal rank of the matrix, $\tilde{B}_x = [\tilde{b}_x(\theta_1,\varphi_1), \tilde{b}_x(\theta_2,\varphi_2), \ldots, \tilde{b}_x(\theta_K,\varphi_K)]$ and $\tilde{B}_y = [\tilde{b}_y(\theta_1,\varphi_1), \tilde{b}_y(\theta_2,\varphi_2), \ldots, \tilde{b}_y(\theta_K,\varphi_K)]$ represent factor sub-matrices, and $k_{rank}(\tilde{B}_x) = \min(V_x, K)$, $k_{rank}(\tilde{B}_y) = \min(V_y, K)$, $k_{rank}(\tilde{B}_x^*) = \min(V_x, K)$, $k_{rank}(\tilde{B}_y^*) = \min(V_y, K)$, $\min(\cdot)$ presents minimum taking operation; therefore, the uniqueness condition for the CANDECOMP/PARACFAC decomposition is transformed into:

$$2\min(V_x,K) + 2\min(V_y,K) \geq 2K+3,$$

according to the above inequality, the number K of the distinguishable sources is greater than the number of the actual physical array elements, the maximum value of K is $$\left\lfloor \frac{2(V_x + V_y) - 3}{2} \right\rfloor,$$

and $\lfloor \cdot \rfloor$ represents a rounding operation.

6. The spatial spectrum estimation method with enhanced degree-of-freedom based on block sampling tensor construction for coprime planar array of claim 1, wherein the signal and noise subspaces obtained by the fourth-order auto-correlation coarray tensor CANDECOMP/PARACFAC decomposition are utilized to construct the tensor spatial spectrum function in step (7); a two-dimensional direction-of-arrival $(\tilde{\theta}, \tilde{\varphi})$, $\tilde{\theta} \in [-90°, 90°]$, $\tilde{\varphi} \in [0°, 180°]$ for spectrum peak search are defined at first, and the steering information $\tilde{v}(\tilde{\theta}, \tilde{\varphi}) \in \mathbb{C}^{V_x V_y}$ corresponding to the virtual uniform array $\mathbb{W}$ is constructed, which is expressed as:

$$\tilde{v}(\tilde{\theta},\tilde{\varphi}) = \tilde{b}_x(\tilde{\theta},\tilde{\varphi}) \otimes \tilde{b}_y(\tilde{\theta},\tilde{\varphi})$$

the tensor spatial spectrum function $(\tilde{\theta}, \tilde{\varphi})$ based on the noise subspace is expressed as follows:

$$\mathcal{P}(\tilde{\theta}, \tilde{\varphi}) = \frac{1}{\tilde{v}^H(\tilde{\theta},\tilde{\varphi}) \tilde{E}_n \tilde{E}_n^H \tilde{v}(\tilde{\theta},\tilde{\varphi})},$$

thus, the tensor spatial spectrum with enhanced degree-of-freedom corresponding to the two-dimensional search direction-of-arrival $(\tilde{\theta}, \tilde{\varphi})$ is obtained.

\* \* \* \* \*